United States Patent
Behdjat et al.

(10) Patent No.: US 10,373,859 B2
(45) Date of Patent: Aug. 6, 2019

(54) SUPPORT RING WITH MASKED EDGE

(71) Applicant: Applied Materials, Inc., Santa Clara, CA (US)

(72) Inventors: Mehran Behdjat, San Jose, CA (US); Norman L. Tam, Cupertino, CA (US); Aaron Muir Hunter, Santa Cruz, CA (US); Joseph M. Ranish, San Jose, CA (US); Koji Nakanishi, Taito-Ku (JP); Toshiyuki Nakagawa, Narita (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/029,159

(22) Filed: Jul. 6, 2018

(65) Prior Publication Data

US 2018/0315639 A1   Nov. 1, 2018

Related U.S. Application Data

(63) Continuation of application No. 15/838,060, filed on Dec. 11, 2017, now Pat. No. 10,056,286, which is a
(Continued)

(51) Int. Cl.
*H01L 21/687* (2006.01)
*H01L 21/67* (2006.01)
*C23C 16/50* (2006.01)

(52) U.S. Cl.
CPC ........ *H01L 21/68757* (2013.01); *C23C 16/50* (2013.01); *H01L 21/67115* (2013.01); *H01L 21/68735* (2013.01); *H01L 2221/683* (2013.01)

(58) Field of Classification Search
CPC .............. C23C 16/50; H01L 21/67115; H01L 21/68735; H01L 21/68757; H01L 2221/683
See application file for complete search history.

(56) References Cited

U.S. PATENT DOCUMENTS 5,848,889 A  *  12/1998  Tietz ................. H01L 21/68735
                                                           432/258
5,884,412 A  *   3/1999  Tietz ..................... C23C 16/455
                                                            34/314
(Continued)

FOREIGN PATENT DOCUMENTS

CN        202205699 U        4/2012
EP         0840358 A2        5/1998
(Continued)

OTHER PUBLICATIONS

Search Report and Written Opinion for International Application Serial No. PCT/US2014/067367 dated Mar. 10, 2015.
(Continued)

*Primary Examiner* — Marc Carlson
(74) *Attorney, Agent, or Firm* — Patterson + Sheridan LLP

(57) ABSTRACT

A support ring for semiconductor processing is provided. The support ring includes a ring shaped body defined by an inner edge and an outer edge. The inner edge and outer edge are concentric about a central axis. The ring shaped body further includes a first side, a second side, and a raised annular shoulder extending from the first side of the ring shaped body at the inner edge. The support ring also includes a coating on the first side. The coating has an inner region of reduced thickness region abutting the raised annular shoulder.

20 Claims, 5 Drawing Sheets

Related U.S. Application Data continuation of application No. 15/144,446, filed on May 2, 2016, now Pat. No. 9,842,759, which is a continuation of application No. 14/218,597, filed on Mar. 18, 2014, now Pat. No. 9,330,955.

(60) Provisional application No. 61/922,451, filed on Dec. 31, 2013.

(56) References Cited

U.S. PATENT DOCUMENTS

| | | | |
|---|---|---|---|
| 6,048,403 | A | 4/2000 | Deaton et al. |
| 6,264,467 | B1 * | 7/2001 | Lue .................... C23C 16/4581 211/41.18 |
| 6,280,183 | B1 * | 8/2001 | Mayur ................ C23C 16/4585 432/253 |
| 6,383,931 | B1 | 5/2002 | Flanner et al. |
| 6,395,363 | B1 | 5/2002 | Ballance et al. |
| 6,530,994 | B1 | 3/2003 | Mahawili |
| 6,893,507 | B2 | 5/2005 | Goodman et al. |
| 7,241,345 | B2 | 7/2007 | Ramamurthy et al. |
| 7,648,579 | B2 | 1/2010 | Goodman et al. |
| 7,704,327 | B2 | 4/2010 | Waldhauer et al. |
| 7,960,293 | B2 | 6/2011 | Honda et al. |
| 7,972,973 | B2 | 7/2011 | Kobayashi et al. |
| 8,296,091 | B2 | 10/2012 | Timans |
| 8,744,250 | B2 * | 6/2014 | Koelmel ................ F27D 11/12 392/418 |
| 8,979,087 | B2 | 3/2015 | Ranish et al. |
| 9,330,955 | B2 * | 5/2016 | Behdjat ............ H01L 21/68757 |
| 9,659,809 | B2 * | 5/2017 | Behdjat ............ H01L 21/67115 |
| 2003/0029571 | A1 | 2/2003 | Goodman et al. |
| 2004/0250772 | A1 | 12/2004 | Ramamurthy et al. |
| 2005/0022746 | A1 | 2/2005 | Lampe et al. |
| 2011/0126894 | A1 | 6/2011 | Nishimiya et al. |
| 2011/0126984 | A1 * | 6/2011 | Kang ................ H01J 37/32091 156/345.51 |
| 2013/0026693 | A1 * | 1/2013 | Ranish ............. H01L 21/67115 269/305 |
| 2013/0058636 | A1 | 3/2013 | Koelmel et al. |
| 2015/0017887 | A1 * | 1/2015 | Kobayashi ............ B24B 37/013 451/59 |
| 2015/0187630 | A1 * | 7/2015 | Behdjat ............ H01L 21/68757 269/302 |
| 2015/0187631 | A1 * | 7/2015 | Ranish ............. H01L 21/67115 269/305 |
| 2016/0247708 | A1 * | 8/2016 | Behdjat ............ H01L 21/68757 |
| 2018/0102274 | A1 * | 4/2018 | Behdjat ............ H01L 21/68757 |

FOREIGN PATENT DOCUMENTS

| | | |
|---|---|---|
| KR | 20010087542 A | 9/2001 |
| KR | 100856019 B1 | 9/2008 |
| KR | 100940544 B1 | 2/2010 |
| TW | 200504807 | 2/2005 |
| WO | 03087430 A1 | 10/2003 |
| WO | 2014035346 A1 | 3/2014 |

OTHER PUBLICATIONS

Taiwan Office Action dated Sep. 2, 2016 for Application No. 103146598.

Taiwan Office Action dated Nov. 29, 2016 for Application No. 105121783.

Taiwan Office Action dated Mar. 28, 2018 for Application No. 106118280.

* cited by examiner

SUPPORT RING WITH MASKED EDGE

CROSS REFERENCE TO RELATED APPLICATIONS

This application is a continuation of and claims benefit to U.S. patent application Ser. No. 15/838,060 filed Dec. 11, 2017, which is a continuation of and claims benefit of U.S. patent application Ser. No. 15/144,446 filed May 2, 2016, which is a continuation of and claims benefit of U.S. patent application Ser. No. 14/218,597 filed Mar. 18, 2014, which claims benefit of U.S. Provisional Patent Application Ser. No. 61/922,451, filed Dec. 31, 2013. Each of the aforementioned patent applications is herein incorporated by reference in its entirety.

FIELD

Aspects of the present invention relate generally to devices used to support substrates and methods for forming such devices. More particularly, embodiments of the present invention relate to a support ring to support an edge ring in a thermal processing chamber.

BACKGROUND

In the processing of substrates, such as semiconducting wafers, a substrate is placed on a support in a processing chamber while suitable processing conditions are maintained in the processing chamber. A rapid thermal processing (RTP) chamber may be used to heat the substrate with lamps disposed below the substrate. For example, a substrate could be rapidly heated to an elevated temperature within a temperature range of 250° C. to 1,350° C. During a thermal process, a substrate may be supported by a supporting structure, such as an edge ring, around the edge region of the substrate. The edge ring may be supported by another supporting structure, such as a support ring.

The edge ring and support ring are constructed of materials that can withstand numerous cycles of being rapidly heated and cooled. Quartz (e.g., amorphous silica) is a material often used for the support ring structure. When heating a substrate from below with lamps in a RTP chamber, it is typically desirable to block lamp radiation from entering the area above the substrate in the RTP chamber. Radiation sensors that are sensitive to radiation emitted by the substrate, such as pyrometers, are often used in the area above the substrate. Preventing lamp radiation from entering the area above the substrate prevents radiation from hampering performance of the temperature sensors. Because quartz is transparent to light and infrared energy, the upper surface of a quartz support ring is often coated with a material, such as silicon, to render it opaque to the lamp radiation.

Quartz support rings coated with silicon begin to develop cracks in the radial direction after being repeatedly heated and cooled. The cracks may begin to develop after only a few heating cycles. The cracks eventually make the quartz support rings coated with silicon unusable, and frequent replacement of support rings is not cost effective.

Therefore, a need exists for improved quartz support rings having opaque coatings.

SUMMARY

In one embodiment, a support ring for semiconductor processing is provided. The support ring includes a ring shaped body with an inner edge and an outer edge, wherein the inner edge and outer edge are concentric about a central axis. The ring shaped body further includes a first side, a second side, and a raised annular shoulder extending from the first side of the ring shaped body at the inner edge. The support ring also includes a coating on the first side, the coating having an inner region of reduced thickness region abutting the raised annular shoulder.

In another embodiment, a support ring for semiconductor processing is provided. The support ring includes a ring shaped body with an inner edge and an outer edge, wherein the inner edge and outer edge are concentric about a central axis. The ring shaped body further includes a first side and a second side. The support ring also includes a coating on the first side, the coating having an outer radiation blocking region of uniform thickness and an inner region of reduced thickness configured to support an edge ring.

In another embodiment a method for coating a ring shaped body in a deposition chamber is provided. The method includes providing the ring shaped body to the deposition chamber, the ring shaped body having an inner edge and an outer edge, wherein the inner edge and the outer edge are concentric about a central axis, and a first side and a second side, placing a mask over the first side at the inner edge, wherein a distance between the mask and the first side is less than about 500 microns, and forming a coating on the first side, wherein the mask reduces the thickness of the coating on the first side under the mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

A support ring with improved durability for repeated heated and cooling, and a method for making such a support ring, are described. The support rings described herein are resistant to cracking under thermal stresses created by repeatedly heating to a temperature between about 250° C. and about 1,350° C. and cooling to an ambient temperature.

Figure 1:
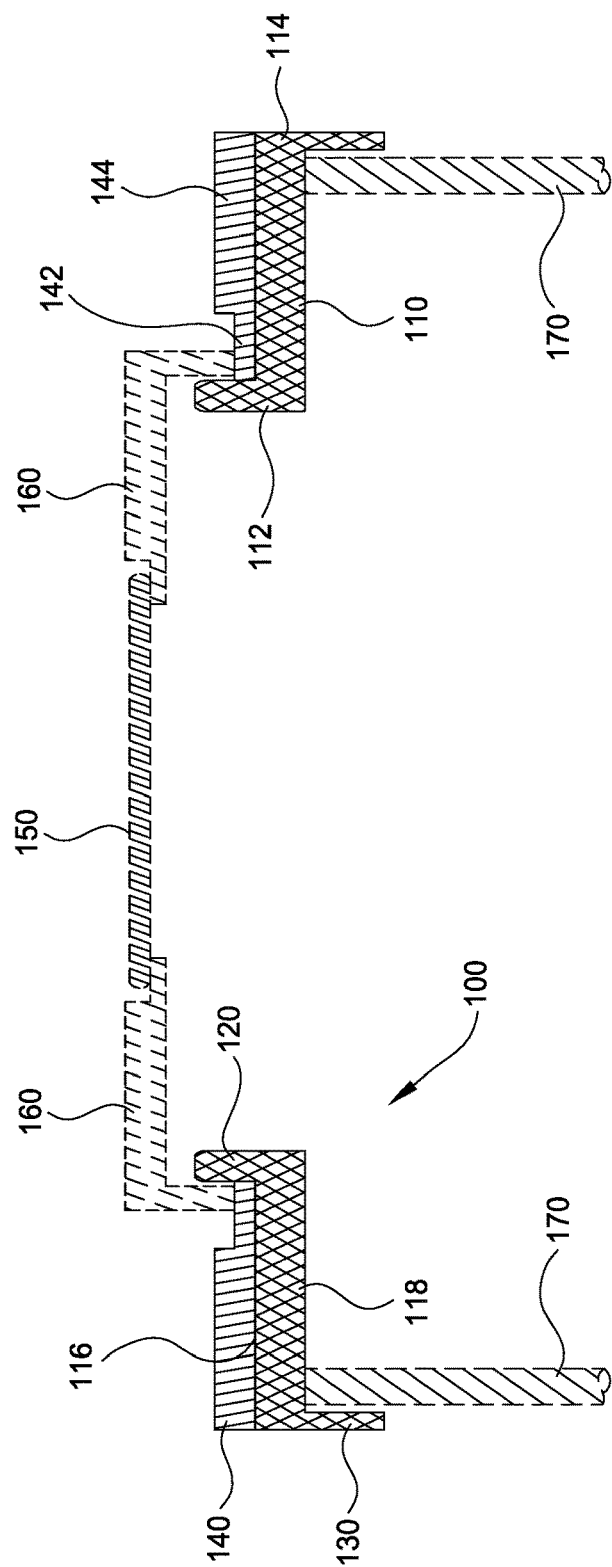
FIG. 1 is a sectional view of a support ring according to one embodiment of the present invention.

FIG. 1 is a sectional view of a support ring 100 according to one embodiment. The support ring 100 is configured to support an edge ring 160 in a thermal processing chamber (not shown). The edge ring 160 is used to support a substrate 150 that can be processed inside the chamber. Generally, the support ring 100 is disposed on a chamber component, such as cylinder 170.

The support ring 100 includes a ring shaped body 110. The ring shaped body 110 may be defined by an inner edge 112 and an outer edge 114, wherein the inner edge 112 and outer edge 114 may be concentric about a central axis of the ring shaped body 110. The ring shaped body 110 further includes a first side 116, a second side 118, and a raised annular shoulder 120 extending from the first side 116 of the ring shaped body 110 at the inner edge 112. The support ring 100 also includes a coating 140 on the first side 116, the coating 140 having an outer region of uniform thickness 144 and an inner region of reduced thickness 142 abutting the raised annular shoulder 120. The outer region of uniform thickness 144 extends radially outward beyond the inner region of reduced thickness 142. The outer region of uniform thickness 144 is thicker than the inner region of reduced thickness 142. The outer region of uniform thickness 144 and the inner region of reduced thickness 142 could be ring shaped. The inner region of reduced thickness 142 could be configured to support the edge ring 160. The support ring 100 may also include a positioning rim 130 to position the support ring 100 on the cylinder 170.

The ring shaped body 110 could be composed of quartz (e.g., amorphous silica), silicon carbide, silicon oxide (such as amorphous glass), ceramic, or any other heat resistant material. Combinations of such materials may also be used.

The coating 140 could be composed of silicon, which may have any convenient morphology, such as polysilicon, monocrystalline silicon, microcrystalline silicon, nanocrystalline silicon, amorphous silicon, and the like. The outer region of uniform thickness 144 could be an outer radiation blocking region. A silicon coating of 25 microns or more may render a coated surface of the support ring 100 opaque to wavelengths of radiation in the operating range of one or more pyrometers (not shown) used to measure the temperatures inside a processing chamber. The one or more pyrometers could measure the temperature from above the support ring 100 while a heating source (not shown) could be located below the support ring 100. Opaque means that the mean intensity of the radiation in the operating range of the pyrometer passing through the coating 140 from a heating source, such as lamps (not shown) disposed below support ring 100, is at least six orders of magnitude lower than the incident radiation received by the support ring 100 on surfaces, such as second side 118, facing the heating source. Coating 140 could be designed with a thickness and other properties to ensure that the radiation passing through coating 140 is at least twelve orders of magnitude lower than the incident radiation received by the support ring 100 from the heating source. Using a coating that is opaque to wavelengths at which the pyrometer is sensitive ensures that substantially no radiation in that range of wavelengths coming directly from the heating source reaches the one or more pyrometers.

The thickness of the coating 140 in the outer region of uniform thickness 144 could be between 25 and 75 microns, such as between about 30 microns and about 60 microns, for example 50 microns. In some embodiments, the thickness of the coating 140 in the outer region of uniform thickness could be between about 50 microns and 500 microns, for example 150 microns. Although, the thickness of the coating 140 in the outer region of uniform thickness 144 is substantially uniform, it is not required to be a constant thickness. For example the thickness of the outer region of uniform thickness 144 could vary along a radial dimension of support ring 100. The thickness of the coating 140 in the outer region of uniform thickness 144 may be thick enough to make the outer region of uniform thickness substantially opaque to at least some wavelengths of radiation energy directed at the second side 118 of the support ring 100 from a heating source. The thickness of the coating 140 in the inner region of reduced thickness 142 could be between about 1 micron and about 30 microns, such as between about 5 microns and about 20 microns, for example 10 microns. The inner region of reduced thickness 142 could also be described as an inner region of minimum thickness.

Figure 2A:
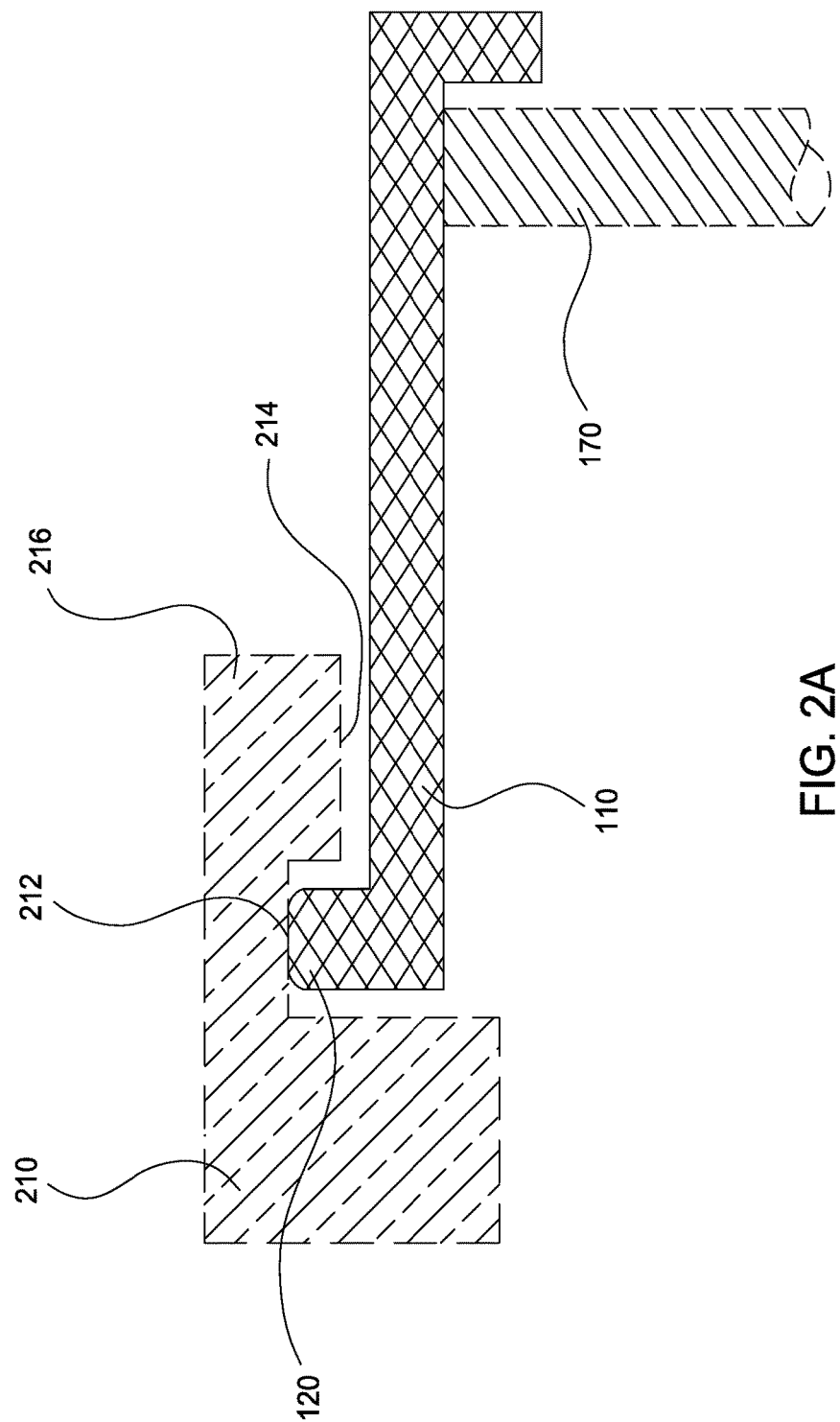
FIG. 2A is a sectional view of a ring shaped body and a mask used to create one embodiment of the present invention.
Figure 2B:
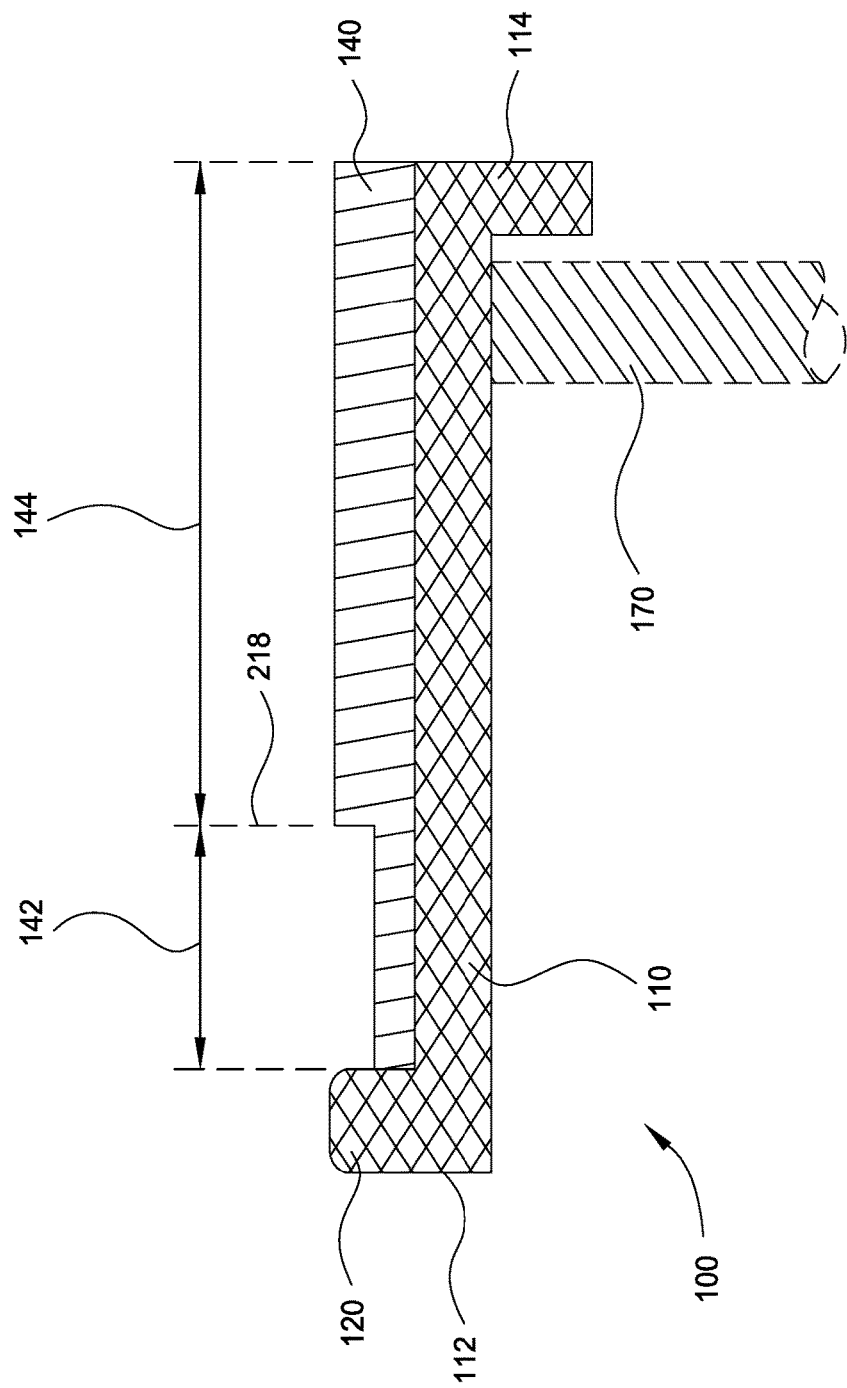
FIG. 2B is a sectional view of a support ring having a coating according to one embodiment of the present invention.

FIG. 2A shows a sectional view of a mask 210 that can be used to form coating 140 on the ring shaped body 110. FIG. 2B shows a sectional view of support ring 100 having the coating 140, which can be formed through the use of mask 210. Mask 210 could be ring shaped and includes a supporting surface 212 that can be used to support the mask 210 on the raised annular shoulder 120 during the formation of the coating 140. The mask 210 also includes a masking surface 214 that is used to reduce the thickness of the coating 140 in the inner region of reduced thickness 142 during the formation of coating 140. The mask 210 also includes an outer surface 216 that creates a uniform thickness boundary 218 between the inner region of reduced thickness 142 and the outer region of uniform thickness 144 when the coating 140 is formed.

Referring to FIGS. 1 and 2B, the uniform thickness boundary 218 could be formed at a location where an outer edge of a supporting surface of the edge ring 160 could be supported. If the edge ring 160 is also composed of a radiation blocking material, such as silicon carbide, which may be opaque to some wavelengths or spectra of radiation, substantially all of the light and infrared energy radiating from beneath the support ring 100 in the thermal processing chamber is blocked or absorbed by the substrate 150, the edge ring 160, or the outer region of uniform thickness 144.

Referring to FIGS. 1, 2A and 2B, a method to form coating 140 on ring shaped body 110 could include providing the ring shaped body 110 to a deposition chamber (not shown), placing the mask 210 over the first side 116 at the inner edge 112, and forming the coating 140 on the first side 116. The mask 210 reduces the thickness of coating 140 on the first side 116 that is under the masking surface 214. The distance between the masking surface 214 and the first side 116 could be between about 10 microns and about 500 microns, for example about 200 microns. In some embodiments, the distance between the masking surface 214 and the first side 116 could be between about 1 micron and about 30 microns, such as between about 5 microns and about 20 microns, for example 10 microns.

Figure 3A:
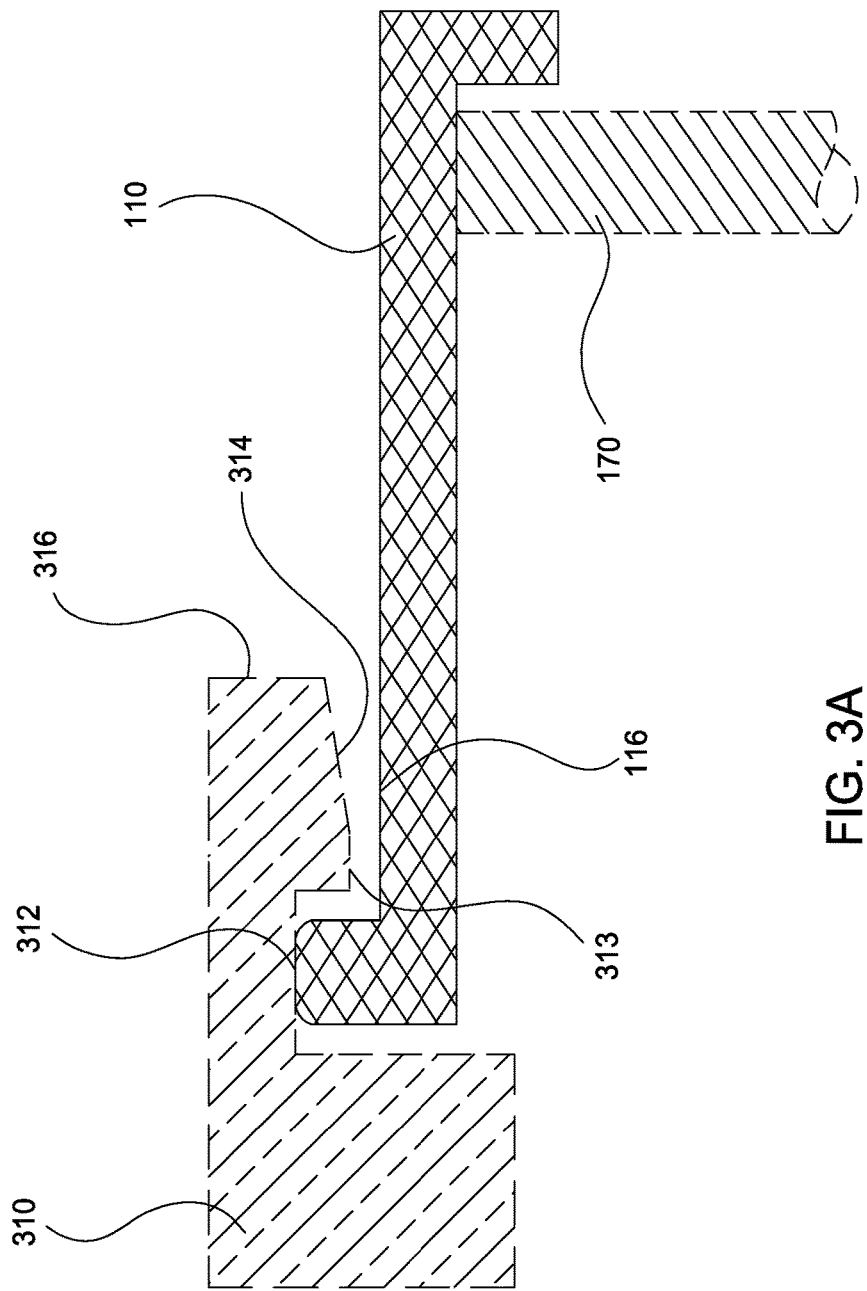
FIG. 3A is a sectional view of a ring shaped body and a tapered mask used to create one embodiment of the present invention.
Figure 3B:
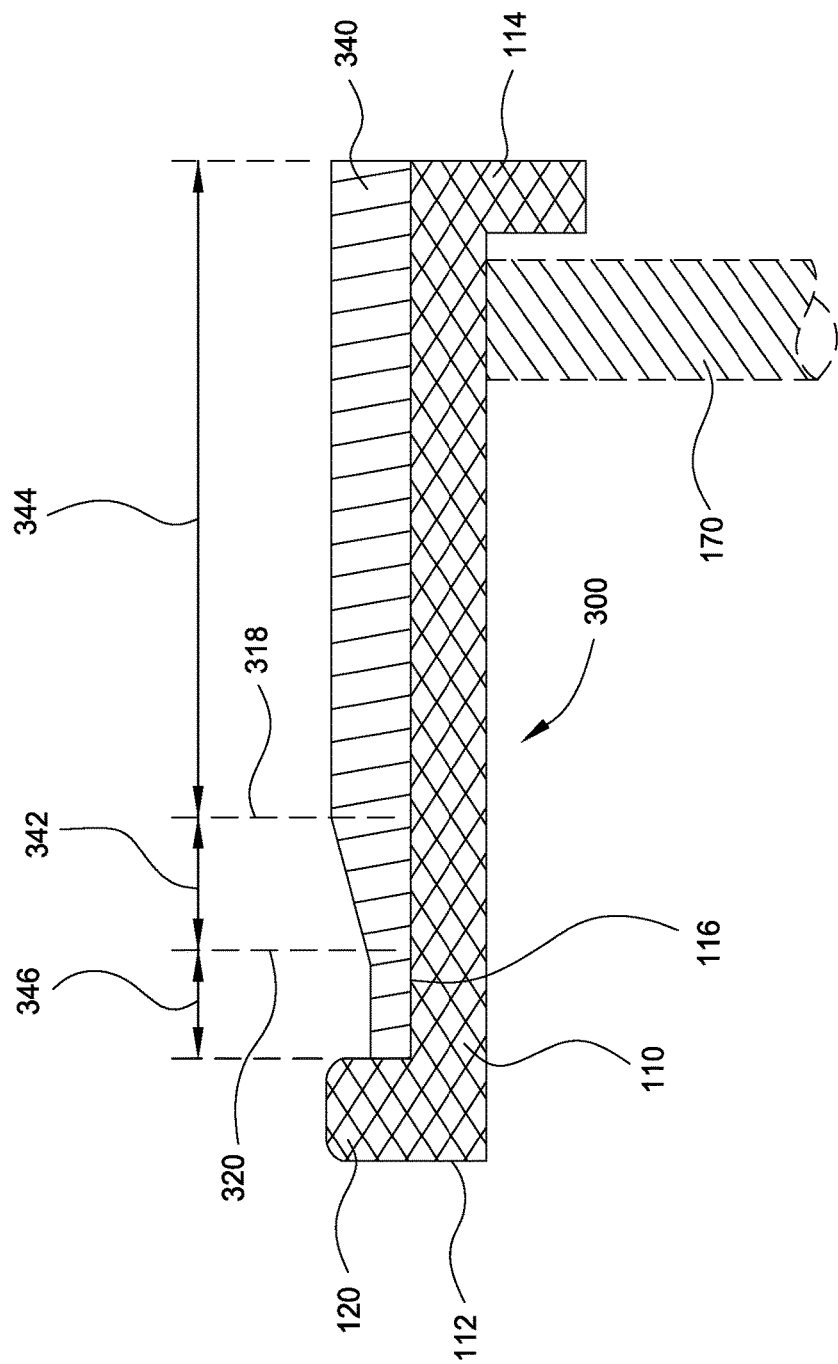
FIG. 3B is a sectional view of a support ring with a tapered coating according to one embodiment of the present invention.

FIG. 3A shows a sectional view of a tapered mask 310 that can be used to form a tapered coating 340 on the ring shaped body 110. FIG. 3B shows a sectional view of a support ring 300 having the tapered coating 340, which can be formed through use of tapered mask 310. Tapered mask 310 could be ring shaped and includes a tapered mask supporting surface 312 that can be used to support the tapered mask 310 on the raised annular shoulder 120 during the formation of the tapered coating 340. Tapered mask 310 is tapered to reduce the thickness of tapered coating 340 as tapered coating 340 approaches inner edge 112. The tapered mask 310 also includes a tapered masking surface 314 that is used to reduce the thickness of the tapered coating 340 in a tapering region 342 during the formation of tapered coating 340. The tapered masking surface 314 could have a substantially linear slope relative to the first side 116. The tapered mask 310 also includes an outer surface 316 that creates an outer tapering boundary 318 between the tapering region 342 and an outer region of uniform thickness 344 when the tapered coating 340 is formed. Thus, the tapering region 342 (i.e., an inner region along the radial dimension of the ring shaped body 110), borders the outer region of uniform thickness 344 at the outer tapering boundary 318.

The thickness of the tapered coating 340 in the outer region of uniform thickness 344 could have a thickness of between 25 microns and 200 microns, for example 60 microns. In some embodiments, the thickness of the tapered coating 340 in the outer region of uniform thickness 344 could have a thickness of between 200 microns and 500 microns, for example 400 microns The tapered mask 310 could also include a minimum thickness masking surface 313 that could be used to create a region of minimum thickness 346 abutting the raised annular shoulder 120 when the tapered coating 340 is formed. The minimum thickness masking surface 313 could be substantially parallel to the first side 116 of the ring shaped body 110 making the thickness of tapered coating 340 substantially uniform in the region of minimum thickness 346. Although, the thickness of the tapered coating 340 in the region of minimum thickness 346 is substantially uniform, it is not required to be a constant thickness. For example, the thickness of the tapered coating 340 in the region of minimum thickness 346 could vary along a radial dimension of support ring 300. The point where the tapered masking surface 314 meets the minimum thickness masking surface 313 creates an inner tapering boundary 320 after the tapered coating 340 is formed. The inner tapering boundary 320 is between the tapering region 342 and the region of minimum thickness 346 (i.e., the inner region). Thus, the tapered coating 340 tapers from the region of uniform thickness 344 at the outer tapering boundary 318 to the reduced or minimum thickness at the inner tapering boundary 320 located in the inner region of the ring shaped body 110. The tapered coating 340 could have an inner thickness substantially equal to the minimum thickness between the inner tapering boundary 320 and the inner edge 112.

The inner tapering boundary 320 could be a first distance from the inner edge 112 of the ring shaped body 110, wherein the first distance could be between about 0.1 mm and about 20 mm, such as between about 0.5 mm and about 15 mm, for example about 5 mm. The thickness of the tapered coating 340 in the region of minimum thickness 346 could be between about 1 micron and about 30 microns, such as between about 5 microns and about 20 microns, for example 10 microns. The outer tapering boundary 318 could be a second distance from the inner edge 112 of the ring shaped body 110, wherein the second distance is between about between about 0.2 mm and about 25 mm, such as between about 0.5 mm and about 20 mm, for example about 10 mm. In some embodiments, tapered mask 310 could reduce the thickness of the tapered coating 340 for a span between 0.1 mm and 24 mm along a radial dimension from the central axis, for example, a span between 0.5 mm and 5 mm.

The thickness of the tapered coating 340 at the inner tapering boundary 320 could be between about 1 micron and about 30 microns, such as between about 5 microns and about 20 microns, for example 10 microns. The thickness of the tapered coating 340 at the outer tapering boundary 318 could be between about 25 microns and about 75 microns, such as between about 30 microns and about 60 microns, for example 50 microns. In some embodiments, the thickness of the tapered coating 340 at the outer tapering boundary 318 could have a thickness of between 60 microns and 500 microns, for example 250 microns Referring to FIGS. 1, 3A and 3B, a method to form tapered coating 340 could include providing the ring shaped body 110 to a deposition chamber (not shown), placing tapered mask 310 over the first side 116, and forming a tapered coating 340 on the first side 116. The tapered mask 310 reduces the thickness of tapered coating 340 on the first side 116 that is under the tapered masking surface 314 and the minimum thickness masking surface 313. The distance between the tapered masking surface 314 and the first side 116 could taper from a first value to a second value, wherein the first value could be between about 300 microns and about 500 microns, for example 400 microns, and the second value could be between about 10 microns and about 200 microns, for example 50 microns. In some embodiments, the distance between the tapered masking surface 314 and the first side 116 could taper from a first value to a second value, wherein the first value could be between about 25 microns and about 75 microns, for example 50 microns, and the second value could be between about 1 micron and about 30 microns, for example 10 microns. In some embodiments, the distance between the tapered masking surface 314 and the first side 116 could be between 10 microns and 300 microns, for example 50 microns. In some embodiments, the distance between the minimum thickness masking surface 313 and the first side 116 could be between 10 microns and 200 microns, for example 60 microns. In some embodiments, the distance between the minimum thickness masking surface 313 and the first side 116 could be between be between about 1 micron and about 30 microns, such as between about 5 microns and about 20 microns, for example 10 microns.

The first side 116 could be exposed to a silicon precursor material to form the coating 140 or the tapered coating 340. The process for exposing the first side 116 to the silicon precursor material may be a CVD process or a PVD process. In one aspect, a plasma process, such as a plasma spray process or plasma CVD process, may be used. In a plasma CVD process, a silicon deposition precursor, such as a silane, for example trimethyl silane or disilane, may be provided to a processing chamber containing the ring shaped body 110 with the mask 210 or the tapered mask 310 positioned thereon. The silicon deposition precursor may be provided with a plasma forming gas, such as argon or helium. A capacitive or inductive plasma is formed in the processing chamber, and the coating 140 or the tapered coating 340 forms.

Referring to FIG. 1, it has been observed that when a quartz support ring, such as ring shaped body 110, is coated on its upper surface with a silicon layer of substantially uniform thickness and repeatedly heated to an elevated temperature, such as a temperature of at least 900° C., cracks begin to form in the radial direction after only a few cycles. The cracks eventually make the support ring unusable. It has also been observed that when the same support ring has a silicon coating with a region of reduced thickness near the inner edge 112, such as the inner region of reduced thickness 142, and the support ring is repeatedly heated to elevated temperatures, crack formation is substantially delayed or reduced.

While the foregoing is directed to embodiments of the present invention, other and further embodiments of the invention may be devised without departing from the basic scope thereof, and the scope thereof is determined by the claims that follow.

What is claimed is:

1. A support ring for semiconductor processing, comprising:
   a ring shaped body comprising:
      an inner edge and an outer edge;
      a first side and a second side;
   a shoulder extending from the first side of the ring shaped body; and
   a rim extending from the second side of the ring shaped body; and
   a coating deposited on the first side of the ring shaped body, the coating having a thickness of at least 25 microns.

2. The support ring of claim 1, wherein the ring shaped body comprises quartz.

3. The support ring of claim 1, wherein the coating comprises a silicon containing material.

4. The support ring of claim 3, wherein the silicon containing material is polysilicon.

5. The support ring of claim 1, wherein an inner region of the coating has a uniform thickness and an outer region of the coating has a uniform thickness.

6. The support ring of claim 1, wherein the coating extends from the shoulder to the outer edge.

7. The support ring of claim 1, wherein the shoulder extends from the ring shaped body at the inner edge.

8. The support ring of claim 1, wherein the rim extends from the ring shaped body at the outer edge.

9. A support ring for semiconductor processing, comprising:
   a ring shaped body comprising:
      an inner edge and an outer edge;
      a first side and a second side;
   an annular shoulder extending from the first side of the ring shaped body at the inner edge; and
   a rim extending from the second side of the ring shaped body at the outer edge; and
   a coating on the first side of the ring shaped body between the outer edge and the annular shoulder.

10. The support ring of claim 9, wherein the ring shaped body comprises quartz.

11. The support ring of claim 9, wherein the coating is polysilicon.

12. The support ring of claim 9, wherein an inner region of the coating has a uniform thickness and an outer region of the coating has a uniform thickness.

13. The support ring of claim 9, wherein a top surface of an inner region of the coating and a top surface of an outer region of the coating are substantially parallel to a bottom surface of the ring shaped body.

14. The support ring of claim 9, wherein the coating abuts the annular shoulder.

15. A support ring for semiconductor processing, comprising:
   a ring shaped body comprising:
      an inner edge and an outer edge;
      a first side and a second side;
   a shoulder extending from the first side of the ring shaped body at the inner edge; and
   a rim extending from the second side of the ring shaped body; and
   a coating on the first side of the ring shaped body between the outer edge and the shoulder, the coating abutting the shoulder.

16. The support ring of claim 15, wherein the coating comprises a silicon containing material.

17. The support ring of claim 16, wherein the silicon containing material is polysilicon.

18. The support ring of claim 15, wherein the ring shaped body comprises quartz.

19. The support ring of claim 15, wherein a top surface of an inner region of the coating and a top surface of an outer region of the coating are substantially parallel to a bottom surface of the ring shaped body.

20. The support ring of claim 15, wherein an inner region of the coating has a uniform thickness and an outer region of the coating has a uniform thickness.

* * * * *